US008679959B2

(12) United States Patent
Carey et al.

(10) Patent No.: US 8,679,959 B2
(45) Date of Patent: Mar. 25, 2014

(54) HIGH SENSITIVITY PHOTODETECTORS, IMAGING ARRAYS, AND HIGH EFFICIENCY PHOTOVOLTAIC DEVICES PRODUCED USING ION IMPLANTATION AND FEMTOSECOND LASER IRRADIATION

(75) Inventors: James E. Carey, Waltham, MA (US); Xia Li, Beverly, MA (US); Nathaniel J. McCaffrey, Hampton Falls, NH (US)

(73) Assignee: Sionyx, Inc., Beverly, MA (US)

( * ) Notice: Subject to any disclaimer, the term of this patent is extended or adjusted under 35 U.S.C. 154(b) by 566 days.

(21) Appl. No.: 12/553,861

(22) Filed: Sep. 3, 2009

(65) Prior Publication Data

US 2010/0052088 A1    Mar. 4, 2010

Related U.S. Application Data

(60) Provisional application No. 61/093,936, filed on Sep. 3, 2008, provisional application No. 61/155,315, filed on Feb. 25, 2009.

(51) Int. Cl.
*H01L 21/425* (2006.01)
*H01L 21/265* (2006.01)

(52) U.S. Cl.
USPC ........... 438/514; 438/519; 438/522; 438/527; 438/530

(58) Field of Classification Search
USPC .......................... 438/514, 519, 522, 527, 530
See application file for complete search history.

(56) References Cited

U.S. PATENT DOCUMENTS

| | | | |
|---|---|---|---|
| 3,487,223 A | 12/1969 | St. John | |
| 4,201,450 A | 5/1980 | Trapani | |
| 4,277,793 A | 7/1981 | Webb | |
| 4,419,533 A | 12/1983 | Czubatyj et al. | |
| 4,493,942 A | 1/1985 | Sheng et al. | |
| 4,514,582 A | 4/1985 | Tiedje et al. | |
| 4,536,608 A | 8/1985 | Sheng et al. | |
| 4,648,936 A | 3/1987 | Ashby et al. | |
| 4,663,188 A | 5/1987 | Kane | |
| 4,829,013 A | 5/1989 | Yamazaki | |
| 4,965,784 A | 10/1990 | Land et al. | |
| 5,080,725 A | 1/1992 | Green et al. | |
| 5,081,049 A | 1/1992 | Green et al. | |

(Continued)

FOREIGN PATENT DOCUMENTS

| AU | 3666484 | 6/1985 |
|---|---|---|
| GB | 2030766 | 4/1980 |

(Continued)

OTHER PUBLICATIONS

Carey et al., "Fabrication of Micrometer-Sized Conical Field Emitters Using Femtosecond Laser-Assisted Etching of Silicon," Proc. IVMC 2001, 75-76, UC Davis, Davis, CA.

(Continued)

*Primary Examiner* — Thanh V Pham
(74) *Attorney, Agent, or Firm* — Thorpe North & Western LLP

(57) ABSTRACT

The present invention relates generally to methods for high throughput and controllable creation of high performance semiconductor substrates for use in devices such as high sensitivity photodetectors, imaging arrays, high efficiency solar cells and the like, to semiconductor substrates prepared according to the methods, and to an apparatus for performing the methods of the invention.

3 Claims, 14 Drawing Sheets

(56) References Cited

U.S. PATENT DOCUMENTS

| | | | |
|---|---|---|---|
| 5,100,478 A | 3/1992 | Kawabata | |
| 5,114,876 A | 5/1992 | Weiner | |
| 5,164,324 A | 11/1992 | Russell et al. | |
| 5,322,988 A | 6/1994 | Russell et al. | |
| 5,346,850 A | 9/1994 | Kaschmitter et al. | |
| 5,597,621 A | 1/1997 | Hummel et al. | |
| 5,714,404 A | 2/1998 | Mititsky et al. | |
| 5,731,213 A | 3/1998 | Ono | |
| 5,773,820 A | 6/1998 | Osajda et al. | |
| 5,792,280 A | 8/1998 | Ruby et al. | |
| 5,942,789 A * | 8/1999 | Morikawa | 257/459 |
| 6,147,297 A | 11/2000 | Wettling et al. | |
| 6,372,591 B1 | 4/2002 | Mineji et al. | |
| 6,580,053 B1 | 6/2003 | Voutsas | |
| 6,583,936 B1 | 6/2003 | Kaminsky et al. | |
| 6,667,528 B2 | 12/2003 | Cohen et al. | |
| 6,759,262 B2 | 7/2004 | Theil et al. | |
| 6,800,541 B2 | 10/2004 | Okumura | |
| 7,057,256 B2 | 6/2006 | Carey, III et al. | |
| 7,091,411 B2 | 8/2006 | Falk et al. | |
| 7,109,517 B2 | 9/2006 | Zaidi | |
| 7,247,527 B2 | 7/2007 | Shimomura et al. | |
| 7,314,832 B2 | 1/2008 | Kountz et al. | |
| 7,354,792 B2 | 4/2008 | Carey, III et al. | |
| 7,390,689 B2 | 6/2008 | Mazur et al. | |
| 7,442,629 B2 | 10/2008 | Mazur et al. | |
| 7,482,532 B2 | 1/2009 | Yi et al. | |
| 7,498,650 B2 | 3/2009 | Lauxtermann | |
| 7,504,325 B2 | 3/2009 | Koezuka et al. | |
| 7,504,702 B2 | 3/2009 | Mazur et al. | |
| 7,511,750 B2 | 3/2009 | Murakami | |
| 7,745,901 B1 | 6/2010 | McCaffrey et al. | |
| 7,781,856 B2 | 8/2010 | Mazur et al. | |
| 7,816,220 B2 | 10/2010 | Mazur et al. | |
| 7,847,253 B2 | 12/2010 | Carey et al. | |
| 7,884,439 B2 | 2/2011 | Mazur et al. | |
| 7,884,446 B2 | 2/2011 | Mazur et al. | |
| 8,030,726 B2 | 10/2011 | Sumi | |
| 8,058,615 B2 | 11/2011 | McCaffrey et al. | |
| 8,207,051 B2 | 6/2012 | Sickler et al. | |
| 8,476,681 B2 | 7/2013 | Haddad et al. | |
| 2003/0029495 A1 | 2/2003 | Mazur et al. | |
| 2004/0222187 A1 | 11/2004 | Lin | |
| 2005/0127401 A1 | 6/2005 | Mazur et al. | |
| 2005/0227390 A1 | 10/2005 | Shtein et al. | |
| 2006/0011955 A1 | 1/2006 | Baggenstoss | |
| 2006/0079062 A1 | 4/2006 | Mazur et al. | |
| 2006/0118781 A1 | 6/2006 | Rhodes | |
| 2006/0166475 A1* | 7/2006 | Mantl | 438/590 |
| 2006/0231914 A1 | 10/2006 | Carey, III et al. | |
| 2007/0145505 A1 | 6/2007 | Kim et al. | |
| 2008/0026550 A1 | 1/2008 | Werner et al. | |
| 2008/0044943 A1 | 2/2008 | Mazur et al. | |
| 2008/0076240 A1 | 3/2008 | Veschtti et al. | |
| 2008/0099804 A1 | 5/2008 | Venezia | |
| 2008/0178932 A1 | 7/2008 | Den Boer et al. | |
| 2008/0258604 A1 | 10/2008 | Mazur et al. | |
| 2009/0065051 A1 | 3/2009 | Chan et al. | |
| 2009/0142879 A1 | 6/2009 | Isaka et al. | |
| 2009/0160983 A1 | 6/2009 | Lenchenkov | |
| 2009/0194671 A1 | 8/2009 | Nozaki et al. | |
| 2009/0200586 A1 | 8/2009 | Mao et al. | |
| 2009/0213883 A1 | 8/2009 | Mazur et al. | |
| 2010/0037952 A1 | 2/2010 | Lin | |
| 2010/0052088 A1 | 3/2010 | Carey | |
| 2010/0055887 A1 | 3/2010 | Piwczyk | |
| 2010/0072349 A1 | 3/2010 | Veeder | |
| 2010/0074396 A1 | 3/2010 | Schmand et al. | |
| 2010/0143744 A1 | 6/2010 | Gupta | |
| 2010/0219506 A1 | 9/2010 | Gupta | |
| 2010/0224229 A1 | 9/2010 | Pralle et al. | |
| 2010/0240169 A1 | 9/2010 | Petti et al. | |
| 2010/0264473 A1 | 10/2010 | Adkisson et al. | |
| 2010/0290668 A1 | 11/2010 | Friedman et al. | |
| 2010/0300505 A1 | 12/2010 | Chen | |
| 2011/0073976 A1 | 3/2011 | Vaillant | |
| 2011/0220971 A1 | 9/2011 | Hadda | |
| 2011/0227138 A1 | 9/2011 | Hadda | |
| 2011/0266644 A1 | 11/2011 | Yamamura et al. | |
| 2011/0303999 A1 | 12/2011 | Sakamoto et al. | |
| 2012/0024363 A1 | 2/2012 | Dimer et al. | |
| 2012/0024364 A1 | 2/2012 | Carey, III et al. | |
| 2012/0111396 A1 | 5/2012 | Saylor et al. | |
| 2012/0171804 A1 | 7/2012 | Moslehi et al. | |
| 2012/0313204 A1 | 12/2012 | Haddad et al. | |
| 2012/0313205 A1 | 12/2012 | Haddad et al. | |

FOREIGN PATENT DOCUMENTS

| | | |
|---|---|---|
| JP | 63116421 | 5/1988 |
| JP | 2152226 | 6/1990 |
| JP | 07/173484 | 7/1995 |
| JP | 9298308 | 11/1997 |
| JP | 2008/187003 | 8/2008 |
| KR | 2001/0061058 | 4/2001 |
| KR | 2010/0118864 | 11/2010 |
| WO | WO 2006/086014 | 8/2006 |
| WO | WO 2008091242 A2 | 7/2008 |
| WO | WO 2009/100023 | 8/2009 |
| WO | WO 2011/035188 | 3/2011 |

OTHER PUBLICATIONS

Carey et al., "Field Emission from Silicon. Microstructures Formed by Femtosecond Laser Assisted Etching," Proc. CLEO 2001 (Baltimore, MD 2001) 555-557.

Carey et al. "Femtosecond Laser-Assisted Microstructuring of Silicon for Novel Detector, Sensing and Display Technologies", LEOS 2002, 97-98, Glasgow, Scotland.

Carey et al., "High Sensitivity Silicon-Based VIS/NIR Photodetectors", Optical Society of America (2003) 1-2.

Carey et al. "Femtosecond Laser-Assisted Microstructuring of Silicon for Novel Detector, Sensing and Display Technologies", LEOS 2003, 481-482, Tucson, AR.

Carey et al., "Femtosecond-Laser-Assisted Microstructuring of Silicon Surfaces", Optics and Photonics News, 2003. 14, 32-36.

Chien et al., "Pulse width Effect in Ultrafast Laser Processing of Materials," 2005, Appl. Phys. A 81, 1257-1263.

Crouch et al., "Comparison of Structure and Properties of Femtosecond and Nanosecond Laser-Structured Silicon" Appl. Phys. Lett., 2004, 84,1850-1852.

Dolgaev et al., "Formation of Conical Microstructures Upon Laser Evaporation of Solids", Appl. Phys. A, 2001, 73, 177-181.

Fowlkes et al., "Surface Microstructuring and Long-Range Ordering of Silicon Nanoparticles", Appl. Phys. Lett., 2002, 80 (20), 3799-3801.

Her et al., "Novel Conical Microstructures Created in Silicon With Femtosecond Laser Pulses", CLEO 1998, 511-512, San Francisco, CA.

Her et al., "Microstructuring of Silicon with Femtosecond Laser Pulses," Applied Physics Letters, 1998, 1673-1675, vol. 73, No. 12, American Institute of Physics.

Her et al., "Femtosecond laser-induced formation of spikes on silicon," Applied Physics A, 2000, 70, 383-385.

Hu et al., "Solar Cells from Basic to Advanced Systems," McGraw Hill Book Co., 1983, 39, New York, New York.

Kim et al., "Strong Sub-Band-Gap Infrared Absorption in Silicon Supersaturated with Sulfur," 2006, Appl. Phys. Lett., 88, 241902-1-241902-3.

Nayak et al., "Semiconductor Laser Crystallization of a-Si:H," 2003, SPIE Digital Library, vol. 4977, 277-380.

Nayak et al., "Semiconductor Laser Crystallization of a-Si:H on Conducting Tin-Oxide-Coated Glass for Solar Cell and Display Applications," 2005, Appl. Phys. A 80, 1077-1080.

Nayak et al, "Ultrafast-Laser-Assisted Chemical Restructuring of Silicon and Germanium Surfaces," 2007, Applied Surface Science, 253, 6580-6583, Elsevier B.V.

Nayak et al, "Ultrafast Laser Textured Silicon Solar Cells," 2009, Mater. Res. Soc. Symp. Proc., vol. 1123, Materials Research Society.

(56) References Cited

OTHER PUBLICATIONS

Pedraza et al., "Surface Nanostructuring of Silicon", Appl. Phys. A, 2003, 77, 277-284.
Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.
Sanchez et al., "Dynamics of the Hydrodynamical Growth of Columns on Silicon Exposed to ArF Excimer-Laser Irradiation", Appl. Phys. A, 1998, 66, 83-86.
Sanchez et al., "Whiskerlike Structure Growth on Silicon Exposed to ArF Excimer Laser Irradiation", Appl. Phys. Lett., 1996, 69 (5), 620-622.
Serpengüzel et al., "Temperature Dependence of Photluminescence in Non-Crystalline Silicon", Photonics West (San Jose, CA, 2004) 454-462.
Shen et al., "Formation of Regular Arrays of Silicon Microspikes by Femtosecond Laser Irradiation Through a Mask", Appl. Phys. Lett., 82, 1715-1717 (2003).
Solar Energy Research Institute, "Basic Photovoltaic Principles and Methods," Van Nostrand Reinhold Co., NY 1984, pp. 45-47 and 138-142.
Tabbal et al., "Formation of Single Crystal Sulfur Supersaturated Silicon Based Junctions by Pulsed Laser Melting," 2007, J. Vac. Sci. Technol. B25(6), 1847-1852.
Wilson, "Depth Distributions of Sulfur Implanted Into Silicon as a Function of Ion energy, Ion Fluence, and Anneal Temperature," 1984, Appl. Phys. 55(10, 3490-3494.
Wu et al., "Black Silicon: A New Light Absorber," APS Centennial Meeting (Mar. 23, 1999).
Wu et al., "Femtosecond laser-gas-solid interactions," Thesis presented to the Department of Physics at Harvard University, pp. 1-113, 126-136, Aug. 2000.
Wu et al., "Visible Luminescence From Silicon Surfaces Microstructured in Air". Appl. Phys. Lett., vol. 81, No. 11, 1999-2001 (2002).
Zhang, et al., "Ultra-Shallow P+-Junction Formation in Silicon by Excimer Laser Doping: a Heat and Mass Transfer Perspective," 1996, Int. J. Heat Mass Transfer, vol. 39, No. 18, 3835-3844, Elsevier Science Ltd, Great Britain.
International Search Report and Written Opinion of the International Searching Authority, Oct. 26, 2009, from counterpart foreign application PCT/US2009/055931, International filing date Sep. 3, 2009.
International Preliminary Report on Patentability of The International Bureau of WIPO, Mar. 8, 2011, from counterpart foreign application PCT/US2009/055931, International filing date Sep. 3, 2009.
Berger, Michael; Moth Eyes Inspire Self-Cleaning Antireflection Nanotechnology Coatings; 2008; 3 pages; Nanowerk LLC.
Boden, S.A. et al.; Nanoimprinting for Antireflective Moth-Eye Surfaces; 4 pages; 2008.
Buttgen, B.; "Demodulation Pixel Based on Static Drift Fields"; IEEE Transactions on Electron Devices, vol. 53, No. 11, Nov. 2006.
Carey, et al., "Fabrication of Micrometer-Sized Conical Field Emitters Using Femtosecond Laser-Assisted Etching of Silicon," Proc. IVMC 2001, 75-76, UC Davis, Davis, CA.
Carey, J.E. PhD Thesis Harvard University, pp. 86-116, 2004.
Chen, Q. et al.; Broadband moth-eye antireflection coatings fabricated by low-cost nanoimprinting; Applied Physics Letters 94; pp. 263118-1-263118-3; 2009; American Institute of Physics.
Cotter, Jeffrey E.; Optical intensity of light in layers of silicon with rear diffuse reflectors; Journal of Applied Physics; Jul. 1, 1998; pp. 618-624; vol. 84, No. 1; American institute of Physics.
Crouch et al., "Comparison of Structure and Properties of Femtosecond and Nanosecond Laser-Structured Silicon" Appl. Phys. Left., 2004, 84, 1850-1852.
Crouch et al., "Infrared Absorption by Sulfur-Doped Silicon Formed by Femtosecond Laser Irradiation", Appl. Phys. A, 2004, 79, 1635-1641.
Despeisse, et al.; "Thin Film Silicon Solar Cell on Highly Textured Substrates for High Conversion Efficiency"; 2004.
Dewan, Rahul et al.; Light Trapping in Thin-Film Silicon Solar Cells with Submicron Surface Texture; Optics Express; vol. 17, No. 25; Dec. 7, 2009; Optical Society of America.
Dobie, et al.; "Minimization of reflected light in photovoltaic modules"; Mar. 1, 2009.
Dobrzanski, L.A. et al.; Laser Surface Treatment of Multicrystalline Silicon for Enhancing Optical Properties; Journal of Materials Processing Technology; p. 291-296; 2007; Elsevier B.V.
Duerinckx, et al.; "Optical Path Length Enhancement for >13% Screenprinted Thin Film Silicon Solar Cells"; 2006.
Dulinski, Wojciech; "Tests of a backside illuminated monolithic CMOS pixel sensor in an HPD setup"; Nuclear Instruments and Methods in Physics Research Section A'; Apr. 1, 2005.
Forbes; "Texturing, reflectivity, diffuse scattering and light trapping in silicon solar cells"; 2012.
Gjessing, J. et al.; 2D back-side diffraction grating for impored light trapping in thin silicon solar cells; Optics Express; vol. 18, No. 6; pp. 5481-5495; Mar. 15, 2010; Optical Society of America.
Goetzberger, et al.; "Solar Energy Materials & Solar Cells"; vol. 92 (2008) pp. 1570-1578.
Haug, et al.; "Light Trapping effects in thin film silicon solar cells"; 2009.
Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.
Huang, et al.; "Microstructured silicon photodetector"; Applied Physics Letters 89, 033506; 2006 American Institute of Physics; 2000.
Hüpkes, J. et al.; Light Scattering and Trapping in Different Thin Film Photovoltaic Devices; 24th European Photovoltaic Solar Energy Conference, Hamburg, Germany (Sep. 21-25, 2009); pp. 2766-2769.
Joy, T. et al.; Development of a Production-Ready, Back-Illuminated CMOS Image Sensor with Small Pixels; Electron Devices Meeting; pp. 1007-1010; 2007; IEEE.
Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.
Kroning et al.; X-ray Imaging Systems for NDT and General Applications; 2002; Fraunhofer Institute for Nondestructive Testing; Saarbrucken and Dresden, Germany.
Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1—25780V-15; vol. 5878; SPIE Bellingham, WA; 2005.
Lin, A. et al.; Optimization of Random Diffraction Gratings in Thin-Film Solar Cells Using Genetic Algorithms; 2007; 1 page; SSEL Annual Report; 2007.
Madzhaov, et al.; "Light trapping in thin-firm silicon solar cells for superstrate and substrate configuration" Abstract #1614, 218th ECS Meeting © 2010 the Electrochemical Society.
Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.
Matsuno, Shigeru et al.; Advanced Technologies for High Efficiency Photovoltaic Systems; Mitsubishi Electric Advance; vol. 122; pp. 17-19; Jun. 2008.
Moloney, A.M. et al.; Novel Black Silicon PIN Photodiodes; 8 pages; Jan. 25, 2006; SPIE.
Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.
Nayak, et al.; "Efficient light trapping in silicon solar cells by ultrafast-laser-induced self-assembled micro/nano structures"; Progress in Photovoltaics: Research and Applications; 2011.
Pain, Bedabrata; "A Back-Illuminated Megapixel CMOS Image Sensor"; http://hdl.handle.net/2014/39312; May 1, 2005.
Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.

(56) References Cited

OTHER PUBLICATIONS

Payne, D.N. R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.

Russell, et al.; "Nanosecond Eximer Laser Processing for Novel Microelectronic Fabrication"; Nanosecond Excimer Laser Processing; 6 pages; 1989.

Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.

Sarnet et al.; "Femtosecond laser for black silicon and photovoltaic cells"; Feb. 21, 2008, Proc. Of SPIE; vol. 6881; pp. 1-15.

Senoussaoul N. et al.; Thin-Film Solar Cells with Periodic Grating Coupler; Thin Solid Films; pp. 397-401; 2003; Elsevier B.V.

Szlufcik, et al.; "Simple integral screenprinting process for selective emitter polycrystalline silicon solar cells"; Appl. Phys. Lett. 59 (13); Sep. 23, 1991.

Tower, et al.; "Large format Backside illuminated CCD Imager for Space Surveillance"; IEEE Transactions on electron Devices, vol. 50, No. 1, Jan. 2003.

Tull; "Femtosecond Laser Ablation of Silicon: Nanoparticles, Doping and Photovotaics"; Harvard University, Jun. 2007 (Thesis).

Winderbaum, S. et al.; Reactive ion etching (RIE) as a method for texturing polycrystalline silicon solar cells; Solar Energy Materials and Solar Cells; 1997; pp. 239-248; Elsevier Science B.V.

Wu, et al, "Near-Unity Below-Band-Gap Absorption by Microstructured Silicon," 2001, Applied Physics Letters, 1850-1852, vol. 78, No. 13, American Institute of Physics.

Yablonovitch, et al.; "Intensity Enhancement in Textured Optical Sheets for Solar Cells"; © 1982 IEEE.

Yamamoto, K. et al.; NIR Sensitivity Enhancement by Laser Treatment for Si Detectors; Nuclear Instruments and Methods in Physics Research A; pp. 520-523; Mar. 31, 2010; Elsevier.

Yan, B.; Light Trapping Effect from Randomized Textures of Ag/ZnO Back Reflector on Hyrdrogenated Amorphous and Nanocrystalline Silicon Based Solar Cells; Thin Film Solar Technology II; vol. 7771; 2010; SPIE.

Younkin, "Surface Studies and Microstructure Fabrication Using Femtosecond Laser Pulses," Thesis presented to the Division of Engineering & Applied sciences at Harvard University (Aug. 2001).

Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.

Zaidi, S.H. et al.; Diffraction Grating Structures in Solar Cells; Photovoltaic Specialists Conference, 2000; 4 pages; Sep. 2000; IEEE.

Kroning et al.; X-ray Imaging Systems for NDT and General Applications; 2002; Fraunhofer Institute for Nondestructive Testing; Saarbrucken and Dresden, Germany; 18 pages.

Younkin et al., "Infrared Absorption by Conical Silicon Microstructures Made in a Variety of Background Gases Using Femtosecond-Laser Pulses", J. Appl. Phys., 93, 2626-2629 (2003).

\* cited by examiner

HIGH SENSITIVITY PHOTODETECTORS, IMAGING ARRAYS, AND HIGH EFFICIENCY PHOTOVOLTAIC DEVICES PRODUCED USING ION IMPLANTATION AND FEMTOSECOND LASER IRRADIATION

CROSS-REFERENCE TO RELATED APPLICATIONS

The present application claims the benefit and priority under 35 U.S.C. §119 of U.S. Provisional Application No. 61/093,936 filed on Sep. 3, 2008, and U.S. Provisional Application No. 61/155,315, filed on Feb. 25, 2009, both of which are hereby incorporated by reference.

TECHNICAL FIELD

The present invention relates generally to methods for high throughput and controllable creation of high performance semiconductor devices such as high sensitivity photodetectors, imaging arrays, high efficiency solar cells and the like.

BACKGROUND

Femtosecond laser irradiation of silicon in the presence of a chalcogen (such as sulfur) under specific conditions has been shown to enable photoactive devices with desirable characteristics. These characteristics include higher sensitivity, extended wavelength response, and higher quantum efficiency at certain wavelengths than untreated silicon. In known systems, the sulfur (or other present ambient chemicals) is embedded into the silicon during femtosecond laser irradiation. The laser sets up a unique atomic and crystallographic arrangement in the silicon substrate. A subsequent thermal anneal activates dopant species, heals lattice damage, and results in the desired photoactive characteristics above.

Requiring a laser to perform both dopant introduction and the subsequent unique arrangement of atoms, however, may not be as efficient or as controllable as needed. What is needed is a process that introduces a desired chemical species to a specific dosage level across a substrate in a controllable and scalable manner, irradiates the substrate and chemical species to a desired atomic and crystalline arrangement, and activates the electronic species contributed by the implanted atoms to produce a semiconductor device having improved characteristics and performance.

SUMMARY

The following is a simplified summary of the invention in order to provide a basic understanding of some of the aspects of the invention. This summary is not intended to identify key or critical elements of the invention or to define the scope of the invention.

An embodiment of the invention is a method for treating a semiconductor substrate. In an embodiment, the method comprises treating a substrate by ion implantation with an electron donating chemical species; and irradiating the substrate with a plurality of short laser pulses in an inert or vacuum environment. The substrate may be a silicon substrate. The chemical species may be a chalcogen. According to an embodiment, the chemical species may be sulfur. Where the chemical species is sulfur, sulfur may be present at an ion dosage level of between about $5 \times 10^{14}$ and $1 \times 10^{16}$ ions/cm$^2$. Other preferred ranges and parameters for certain quantities are provided below, and are nor intended to be limiting, but merely exemplary in description and for illustrative purposes.

The ion implantation may take place in a vacuum. In another embodiment, the environment for ion implantation may be an inert gas, for example, $N_2$ gas.

According to an embodiment, the method may also comprise thermal annealing of the substrate, following laser irradiation. The thermal annealing may be performed by any acceptable methods, for example, by laser annealing, furnace annealing, or be rapid thermal annealing such that the substrate has an elevated temperature sufficient so as to cause an increase in the charge carrier density in a microstructured layer. For example the substrate can be annealed at a temperature in a range of about 500° C. to about 1200° C. Again, further and preferred ranges and values for various parameters are provided below and in the accompanying claims, and these are not intended to limit the scope of the invention beyond that given in the claims.

According to an embodiment, the ion implantation may be performed at an energy of between about 10 keV and about 500 keV. In another embodiment, ion implantation is performed at an energy of about 200 keV. Once again, other ranges and values of these parameters are provided herein for illustrative purposes to explain certain preferred embodiments hereof.

The present invention also includes semiconductor devices comprising substrates prepared according to the methods described herein. According to one embodiment, the invention may comprise a semiconductor device comprising a processed semiconductor substrate prepared according to the method of claim 1. In an embodiment, a silicon substrate is processed by implantation with sulfur, prior to laser irradiation. In an embodiment, the device may include a processed semiconductor substrate comprising at least about $0.5 \times 10^{16}$ sulfur ions/cm$^2$. In another embodiment, the device may include a processed semiconductor substrate having a responsivity of between about 1 amp/watt and about 100 amp/watt. In an alternative embodiment, the laser irradiation step is performed prior to the ion implantation step.

In general, energetic processes which can roughen the surface of a semiconductor material, annealing, and ion implantation, as well as doping are provided to a semiconductor material in a process or in a semiconductor device. The above are provided generally in no particular order, and the energetic processes can include application of a laser, irradiating with a pulsed laser, or other radiative or energetic application of energy to the material in question.

One embodiment hereof is directed to a semiconductor processing method, including providing a semiconductor material having at least a first surface; implanting a dopant into the semiconductor material so as to cause a plurality of ions to be present in at least a portion of said semiconductor material to some depth beneath the surface; and treating at least a portion of said surface with an energy source so as to restructure the semiconductor material in a region proximal to said portion of the first surface being treated.

Another embodiment is directed to a method of controlling a photo-response characteristic of a semiconductor device, including a semiconductor material having at least one surface thereof; incorporating a dopant into a region of the semiconductor material beneath said surface by ion implantation; and roughening said surface by subjecting the surface to a restructuring process to yield a semiconductor device having a substantially uniform photo-response across at least a portion of the surface of said semiconductor device.

Yet another embodiment is directed to a photodetector device including a semiconducting substrate having a first surface; a doped region beneath said surface having a substantially uniform doping concentration therein; and a portion of said doped region proximal to said surface being structurally modified by the application of an energetic process to said surface, and being substantially uniformly responsive to incident electromagnetic radiation in at least a band of wavelengths of the electromagnetic spectrum.

Additional features and advantages of the invention will be made apparent from the following detailed description of illustrative embodiments that proceeds with reference to the accompanying drawings.

IN THE DRAWINGS

The invention is best understood from the following detailed description when read in connection with the accompanying drawings. For the purpose of illustrating the invention, there is shown in the drawings exemplary constructions of the invention; however, the invention is not limited to the specific methods and instrumentalities disclosed. Included in the drawing are the following Figures.

DETAILED DESCRIPTION

Figure 1:
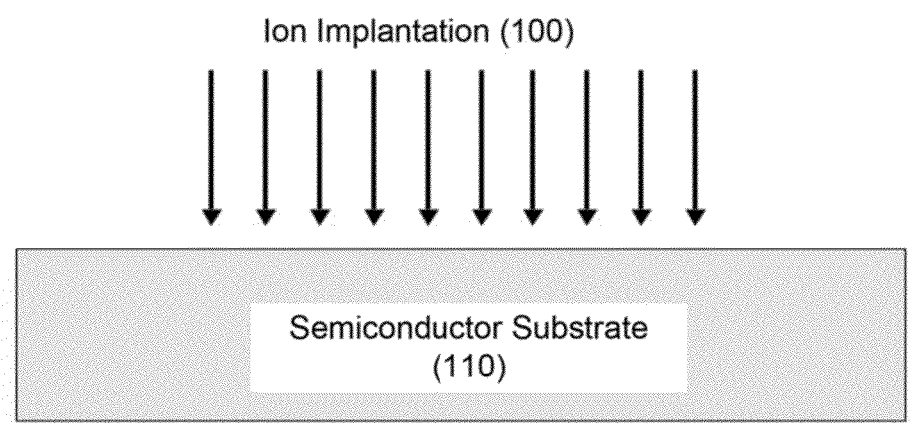
FIG. 1 depicts ion implantation of a semiconductor substrate according to an embodiment of the invention.

The present invention relates to improved methods of treating a semiconductor substrate to achieve dopant introduction and atomic rearrangement of the surface of a semiconductor substrate for production of high sensitivity, extended wavelength response, i.e. about 1150 nanometers (nm) to about 1200 nm, and high quantum efficiency semiconductor materials. The invention has application in high sensitivity photo-detectors, imaging arrays, and high efficiency, photovoltaic devices.

Before the present devices and methods are described, it is to be understood that this invention is not limited to the particular processes, devices, or methodologies described, as these may vary. If is also to be understood that the terminology used in the description is for the purpose of describing the particular versions or embodiments only, and is not intended to limit the scope of the present invention which will be limited only by the appended claims.

In general, energetic processes which can roughen the surface of a semiconductor material, annealing, and ion implantation, as well as doping are provided to a semiconductor material in a process or in a semiconductor device. The above are provided generally in no particular order, and the energetic processes can include application of a laser, irradiating with a pulsed laser, coherent or non-coherent light or other radiation, or other radiative or energetic application of energy to the material in question.

As used herein, and in the appended claims, the singular forms "a", "an" and "the" include plural reference unless the context clearly dictates otherwise. Unless defined otherwise, all technical and scientific terms used herein have the same meanings as commonly understood by one of ordinary skill in the art. Although any methods similar or equivalent to those described herein can be used in the practice or testing of embodiments of the present invention, the preferred methods are now described. All publications and references mentioned herein are incorporated by reference. Nothing herein is to be construed as an admission that the invention is not entitled to antedate such disclosure by virtue of prior invention.

"Optional" or "optionally" may be taken to mean that the subsequently described structure, event or circumstance may or may not occur, and that the description includes instances where the event occurs and instances where it does not.

A "laser-processed" or "laser-treated" semiconductor substrate refers to a substrate that has been modified by exposure to short-pulsed laser treatment. A short-pulsed laser is one capable of producing femtosecond, picosecond and/or nanosecond pulse durations. The surface of the substrate is chemically and/or structurally altered by the laser treatment, which may, in some embodiments, result in the formation of surface features appearing as microstructures or patterned areas on the surface and/or the incorporation of dopants into the substrate. For example, the laser treated substrate may include dopants that were present in a laser processing chamber during the treatment process. The substrate may be treated in the presence of, for example, a sulfur-containing gas or solid, or in a vacuum. Methods of laser-processing a substrate are known, for example, those shown by Carey et al. in U.S. Pat. No. 7,057,256, the entirety of which is hereby incorporated by reference for all purposes.

Embodiments of the present invention include a process that introduces dopant through ion implantation as a controllable and scalable way to perform the first step in the process. The present invention includes the use of ion implantation to achieve implantation of controlled closes of a desired chemical species, followed by a specific short-pulsed laser treatment. In other embodiments, the ion implantation may follow the laser treatment of the substrate. The doped and laser irradiated substrate can be further subjected to a thermal anneal. The method of the invention enables high throughput and controllable creation of various semiconductor devices, including but not limited to high sensitivity photodetectors, imaging arrays, and high efficiency solar cells.

An embodiment of the present invention is a method for producing highly desirable performance characteristics in a semiconductor device. According to an embodiment, the method comprises treating a substrate by ion implantation of a desired chemical species carried out to a specific dosage level, irradiating the substrate with short-pulsed laser irradiation such that a desired atomic and crystalline arrangement is obtained, and performing at least one thermal anneal cycle to activate the electronic species contributed by the implanted atoms.

Any method for ion implantation may be used in the present invention. In an embodiment, the energy level used for ion implantation is between about 10 and about 500 keV. In another embodiment, the energy level used is between about 50 and about 300 keV. In an embodiment, the energy level for ion implantation is about 200 keV.

The ion dosage level may be varied depending on the specific ion to be implanted and the chemical composition of the substrate, as would be understood by one of skill in the art. In an embodiment, the dosage amount of the chemical species is such that the number of chemical species atoms exceeds the solid solubility limit of sulfur in silicon. In other embodiments, the dosage amount is equal to or less than the solid solubility limit of the substrate. In an embodiment, the substrate is silicon, the chemical species comprises sulfur, and the dosage amount is such that the number of sulfur atoms exceeds the solid solubility limit of sulfur in silicon. In other embodiments wherein the substrate is silicon and the chemical species is sulfur, the dosage amount is such that the number of sulfur atoms is equal to or less than the solid solubility limit of sulfur in silicon. For a silicon substrate being doped with sulfur, for example, the ion dosage levels may be between about $5\times10^{14}$ and $1\times10^{16}$ ions/cm$^2$.

Ion implantation depth may vary depending on the energy level used and the substrate composition. An average ion penetration depth (or "range") may be between about 10 nanometers and about 1 micrometer.

In an embodiment, the chemical species is any atom in the periodic table and the substrate material is any semiconductor material. In an embodiment, the chemical species is any chalcogen. In another embodiment, the chemical species is selenium or tellurium. In yet another embodiment, the chemical species is a so called donor atom, such as a phosphorous atom substituting for an atom of silicon. In another embodiment, the chemical species is a so called acceptor atom, such as a boron atom in silicon. According to an embodiment of invention, the chemical species is introduced in the form of ions so that a specific dosage level can be derived and controlled through electric charge counting of ions with an apparatus such as a faraday cup.

Alternatives for doping a substrate may also be employed with the present invention. For example, the substrate may be grown to include the desired amount of the dopant species. The growth method may be an epitaxial method or any other methods known to those skilled in the art. After the dopant layer is grown, a lasing step may subsequently be used to alter the surface properties of the substrate.

In still another embodiment, the substrate may be doped through a plasma doping process or a thermal diffusion process. In a plasma doping process an energetic plasma beam that is composed of dopant ions is introduced into the substrate. In a thermal diffusion process, dopant species are first coated on or near the substrate surface and then diffused into the substrate through a thermal process, i.e. elevating the temperature of the substrate. A co-ion implant doping process may also be used according to another aspect of the present invention. The co-ion implant process is a two step implant process that first implants an electrically neutral specie such as fluorine or carbon into the substrate prior to ion implanting the active dopant species. The electrically neutral specie allows a better electrical activation of the dopant species in the substrate. The co-ion implant process may be perform prior to or after the lasing step. Both of these processes may achieve a similar doped semiconductor substrate as an ion implanted structure. One skilled in the art may choose one process over the other to have more control of the dopant concentrations in the substrate.

In an embodiment, the step of irradiating the substrate may comprise irradiation with short-pulsed lasers such that a desired atomic and crystalline arrangement is obtained. In an embodiment, the pulses are less than 100 nanoseconds in duration. The timescales associated with various mechanisms of energy transfer from excited electrons to a surrounding material dictate whether the mechanisms are thermal or non-thermal. In one embodiment, the pulses are sufficiently short in duration such that the substrate cannot react in a normal thermal way. That is, the energy of a laser pulse is deposited in a time scale much shorter than any thermal process. According to this embodiment, only the electrons in the substrate are affected during the time the laser pulse is present. Depending on the substrate and chemical species used, the laser pulses may be less than 50 picoseconds in duration. In another embodiment, the laser pulses may be less than 1 picosecond in duration.

In one aspect, a method of the invention comprises laser treating or laser processing a substrate. In an embodiment, laser treating comprises irradiating a surface of the substrate with one or more laser pulses. The laser pulses may have a central wavelength in a range of about 200 nm to about 1200 nm, and a pulse width in a range of about tens of femtoseconds to about hundreds of nanometers. Preferably, the laser pulse widths are in a range of about 50 femtoseconds to about 50 picoseconds. In an embodiment, the laser pulse widths are in the range of about 50 to 500 femtoseconds. The number of laser pulses irradiating the silicon surface can be in a range of about 1 to about 2000, and more preferably, in a range of about 20 to about 500.

In an embodiment, the energy in each laser pulse is between 1 nanojoule and 10 microjoules. The energy density (or Fluence) of each laser pulse, in an embodiment, may be between about 0.1 kJ/m$^2$ and about 100 kJ/m$^2$. In an embodiment, the repetition rate of the laser pulses is between 1 Hz and 60 MHz.

By way of example, the ambient environment during laser irradiation may include a vacuum, an inert gas, or a gas species that contains a chalcogen element (such as sulfur). In an embodiment, the ambient environment includes N$_2$ gas. In another embodiment, the gas species is H$_2$S. One advantage of the present invention is that it laser treatment can occur outside the presence of fluorine, which could otherwise be introduced to the substrate as a contaminant. In other embodiments, the substrate may be prepared with a sacrificial masking configured to protect certain regions and portions of the semiconductor substrate from unwanted damage from the lasing process. The type of masking films used are explained in pending U.S. application Ser. No. 12/173,903 filed on Jul. 16, 2008, which is incorporated by reference herein in its entirety. The laser treatment itself can also partially or wholly replace a subsequent annealing step.

In an alternative embodiment, the semiconductor substrate may be treated with an acid bath, i.e. KOH, to achieve similar surface roughening results as would be accomplished with a laser irradiation step. By placing the semiconductor substrate in contact with an acid, surface features, such as cones, having a distance of 800 nm-100 nm from the nearest feature neighbor maybe achieved. The acid bath or surface etching step may be perform on the semiconductor substrate prior to or following the ion implantation step but preceding the annealing step. One skilled in the art will appreciate that other known methods and reagents maybe used to create surface features on the semiconductor substrate.

According to an embodiment, the method of the invention comprises a thermal anneal cycle, or cycles, that activate the electronic species contributed by the implanted atoms. Annealing can be performed according to a variety of methods, including, for example, furnace anneal, rapid thermal anneal, laser anneal and the like. Any process by which the temperature of the implanted and lased substrate is raised to a desired temperature for a specific time is acceptable. In an embodiment, annealing is performed at between about 500° C. and 1000° C. Standard annealing requires exposure of the substrate to annealing conditions for about 15 minutes to one hour; alternatively, rapid thermal annealing ("RTA") (or, rapid thermal processing, "RTP") may be performed, generally requiring much shorter anneal times, in the range of about one millisecond to a few seconds. In an embodiment, annealing is performed using RTA (or RTP). The desired effect of annealing is to activate electronic carriers imparted by the ion implanted species, to heal undesired lattice damage imparted to the substrate during ion implantation and laser irradiation, and/or to engineer the implanted ion species chemical, atomic, and crystallographic arrangement to produce desired semiconductor device performance.

A substrate prepared according to the invention may have an active dopant concentration integrated over the ion penetration depth (or "range") equivalent to the dosage level used during ion implantation. "Integrated over the ion penetration depth" or "integrated over the range" means the total ion concentration implanted in the substrate is equal to the integral value of the dopant concentration at different thicknesses over the range. In an embodiment, the active dopant concentration integrated over the range in a substrate prepared according to an embodiment of the invention is at least about 50% of the ion dosage level used during ion implantation. Accordingly, where the chemical species used in ion implantation is sulfur and the substrate is silicon, the processed semiconductor substrate may comprise at least about $0.5 \times 10^{16}$ sulfur ions/cm$^2$. In another embodiment, the active dopant concentration integrated over the range in a substrate prepared according to a method of the invention is at least about 90% of the ion dosage level used in ion implantation. Other levels of ion dosage may be achieved, depending on the ion used, the composition of the substrate, and the conditions of implantation, as would be understood by one of skill in the art.

A substrate prepared according to one of the embodiments of the invention may have a responsivity of between about 1 amp/watt and about 100 amp/watt. In an embodiment, the responsivity of a substrate prepared according to a method of the invention has a responsivity of about 20 to about 50 amp/watt. In another embodiment, the responsivity of a substrate prepared according to a method of the invention has a responsivity of about 30 amp/watt. As will be understood by one of skill in the art, the responsivity of a substrate prepared according to a method of the invention will depend on the wavelength of the incident radiation and the composition of the substrate.

An advantage of the present invention is increased throughput of processed substrates. For example, the methods of the invention can reduce throughput time for single or multiple wafers processing to a fraction of the processing time required by conventional systems. For example, processing that would conventionally require 60 minutes may be performed in 5 to 15 minutes, when prepared according to certain embodiments of the invention.

Figure 2:
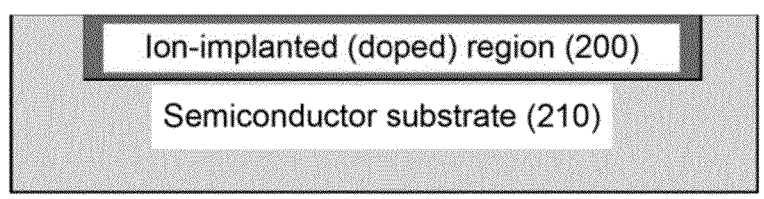
FIG. 2 depicts a semiconductor substrate that has been treated with ion implantation according to an embodiment of the invention.
Figure 3:
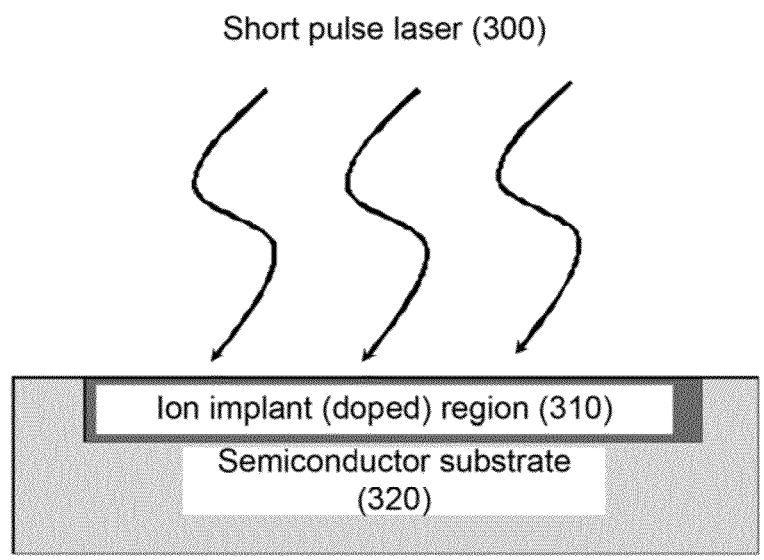
FIG. 3 depicts short-pulse laser irradiation treatment of a semiconductor substrate that has been previously subjected to ion implantation according to an embodiment of the invention.
Figure 4:
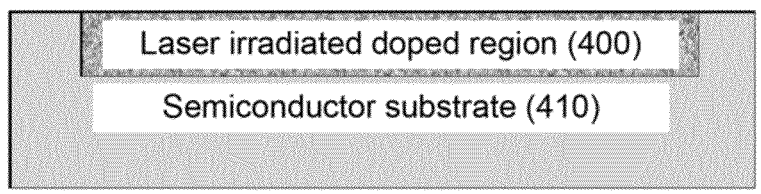
FIG. 4 depicts a semiconductor substrate that has been treated with ion implantation and subsequent short-pulse laser irradiation treatment according to an embodiment of the invention.
Figure 5:
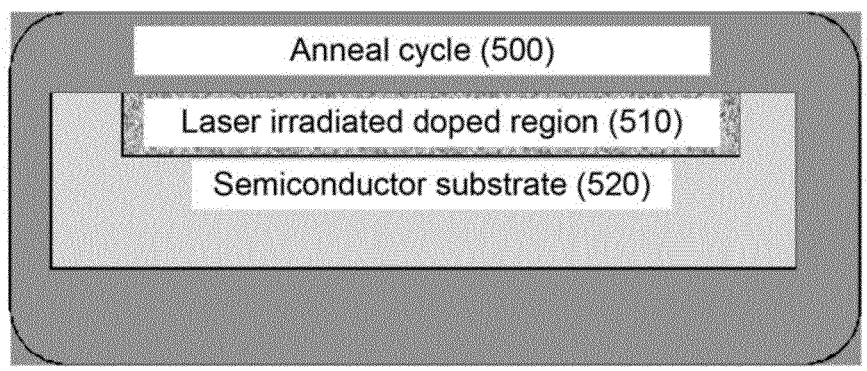
FIG. 5 depicts a semiconductor substrate having a laser irradiated doped region prepared according to an embodiment of the invention, undergoing an anneal cycle treatment.
Figure 6:
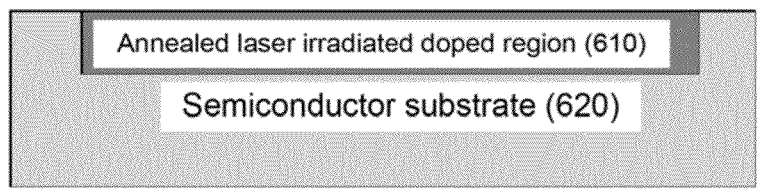
FIG. 6 depicts a semiconductor substrate having an annealed, laser-irradiated and doped region, prepared according to an embodiment of the invention.

An exemplary method according to the invention is represented in the Figures. An embodiment of the invention comprises ion implantation of a substrate to yield a doped substrate, followed by laser processing of the substrate. FIG. 1 depicts ion implantation of a substrate, according to this embodiment, and FIG. 2 depicts the resulting substrate following ion implantation. A region of doped substrate is shown near the substrate surface. FIGS. 3 and 4 depict laser processing of the doped substrate and the doped, laser treated substrate, respectively. The ions of the doped region have been rearranged by laser treatment into a crystal formation. An optional annealing step is shown in FIG. 5, and the annealed substrate in FIG. 6.

Figure 7:
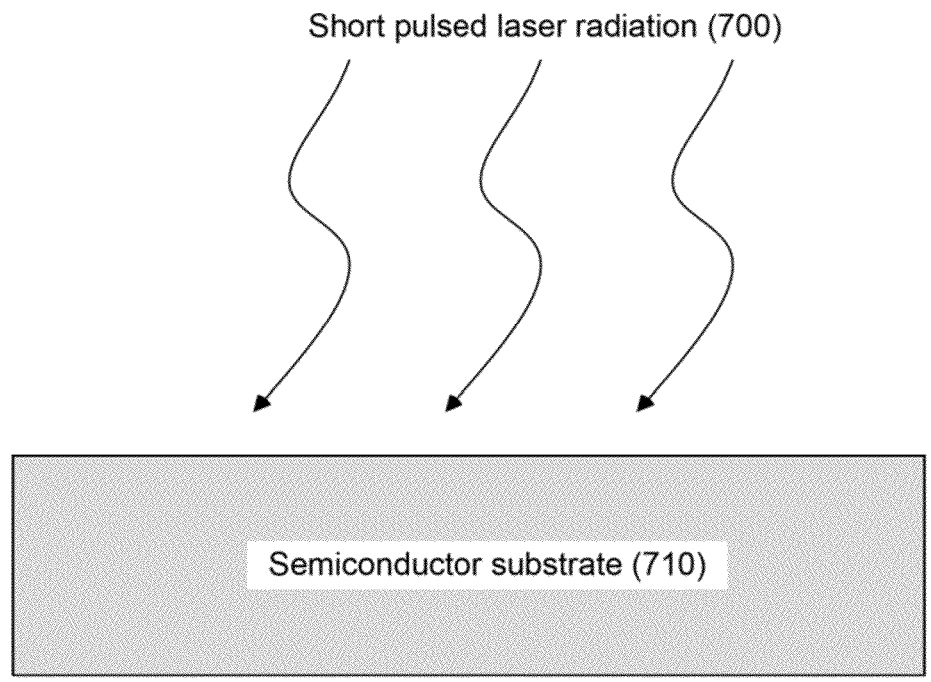
FIG. 7 depicts a short-pulse laser irradiating of a semiconductor substrate according to an embodiment of the present invention.
Figure 8:
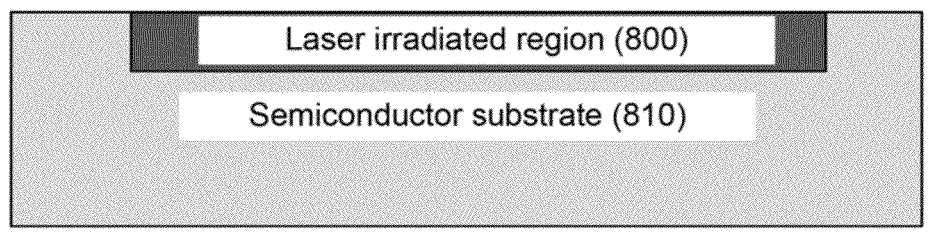
FIG. 8 depicts a semiconductor substrate that has been treated with a short-pulse laser irradiation treatment according to an embodiment of the present invention.
Figure 9:
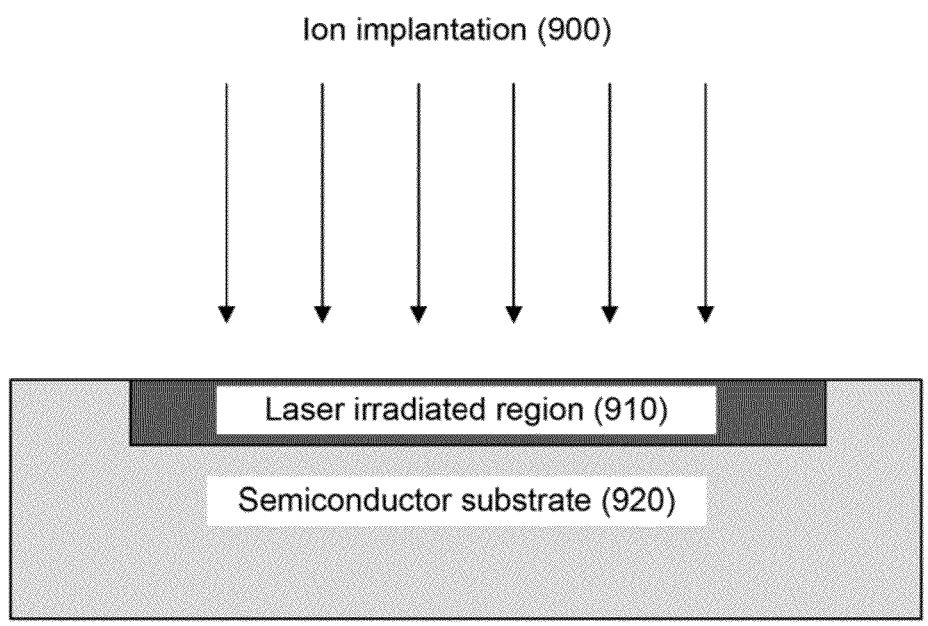
FIG. 9 depicts ion implantation of a semiconductor substrate that has been treated with a short-pulse laser irradiation treatment according to an embodiment of the present invention.
Figure 10:
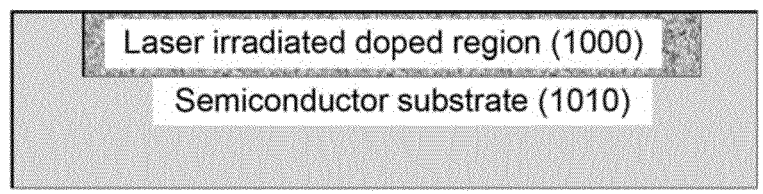
FIG. 10 depicts a semiconductor substrate that has been treated with short-pulse laser irradiation treatment and subsequent ion implantation according to an embodiment of the invention.
Figure 11:
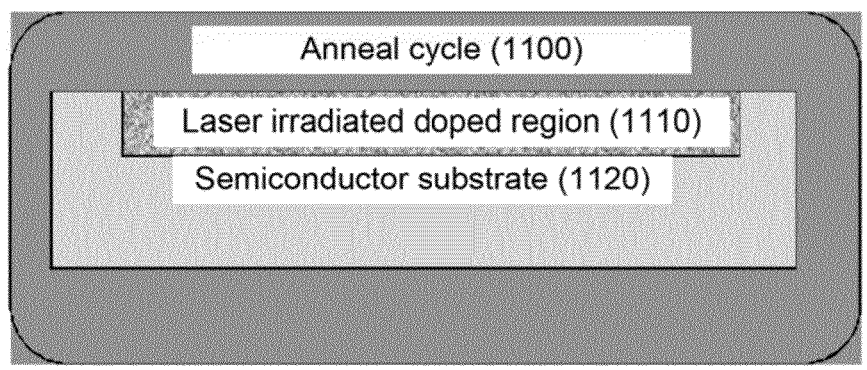
FIG. 11 depicts a semiconductor substrate having a laser irradiated doped region prepared according to an embodiment of the invention, undergoing an anneal cycle treatment.
Figure 12:
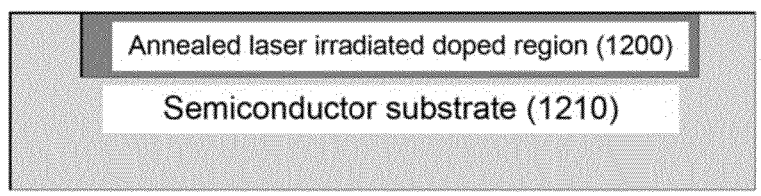
FIG. 12 depicts a semiconductor substrate having an annealed, laser-irradiated and doped region, prepared according to an embodiment of the invention.

FIGS. 7-12 depict another exemplary method according to the present invention. FIG. 7 illustrates a short-pulsed laser irradiation of a semiconductor substrate. FIG. 8 depicts the resulting substrate following the short-pulsed laser irradiation step. FIG. 9 depicts ion implantation of a laser irradiated substrate according to this embodiment. A laser irradiated doped region is shown near the substrate surface in FIG. 10. In other embodiments (not shown) the laser irradiated doped region may be located near the backside of the semiconductor substrate, such that any light incident on the substrate will penetrate and pass through a portion of the substrate prior to contacting the laser irradiated doped region. An optional annealing step is shown in FIG. 11, and the annealed substrate in FIG. 12.

Figure 13:
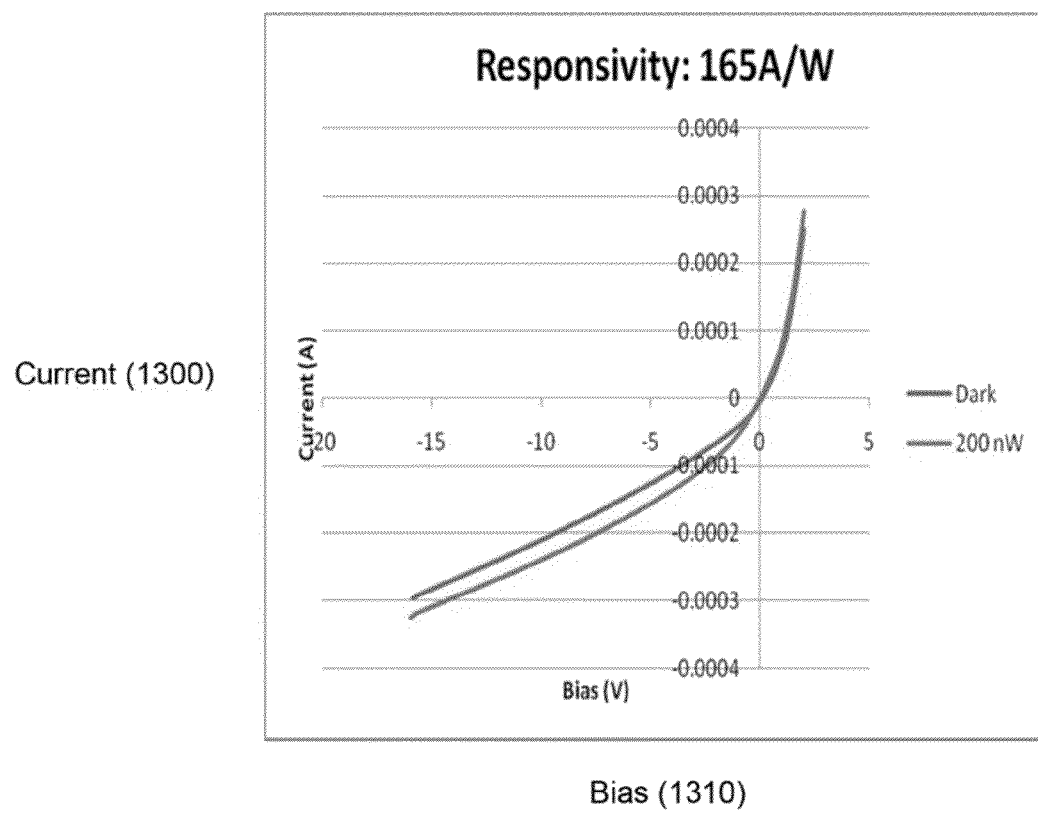
FIG. 13 shows a representative current-voltage (I-V) plot from a device with sulfur implantation and lasing treatment.

FIG. 13 shows a representative current-voltage (I-V) plot from a device with sulfur implantation and lasing treatment. A responsivity of about 165 A/W can be achieved at 5 volts reverse bias. The methods of the invention differ from conventional methods in that dopant introduction by ion implantation takes the place of laser doping. This provides three distinct advantages. 1) The dosage of the implanted chemical species across a wafer/wafers can be better controlled using ion implantation, and therefore, devices prepared according to the invention will be more uniform. For example, ion implantation routinely achieves dopant uniformity within 2% across a wafer. 2) It often takes multiple laser pulses to implant a desired chemical species to a sufficient concentration, resulting in slow processing time and increasing the amount of undesirable laser damage done to the substrate. Ion implantation increases throughput (state-of-the-art ion implanters reach throughputs of over 100 wafers per hour), reduce undesirable laser damage, and further contribute to making the process more scalable. 3) Ion implantation is a more mature and standard method for dopant introduction than convention dopant introduction methods by laser. A process flow according to an embodiment of the invention would be more compatible with current semiconductor manufacturing processes.

Figure 14:
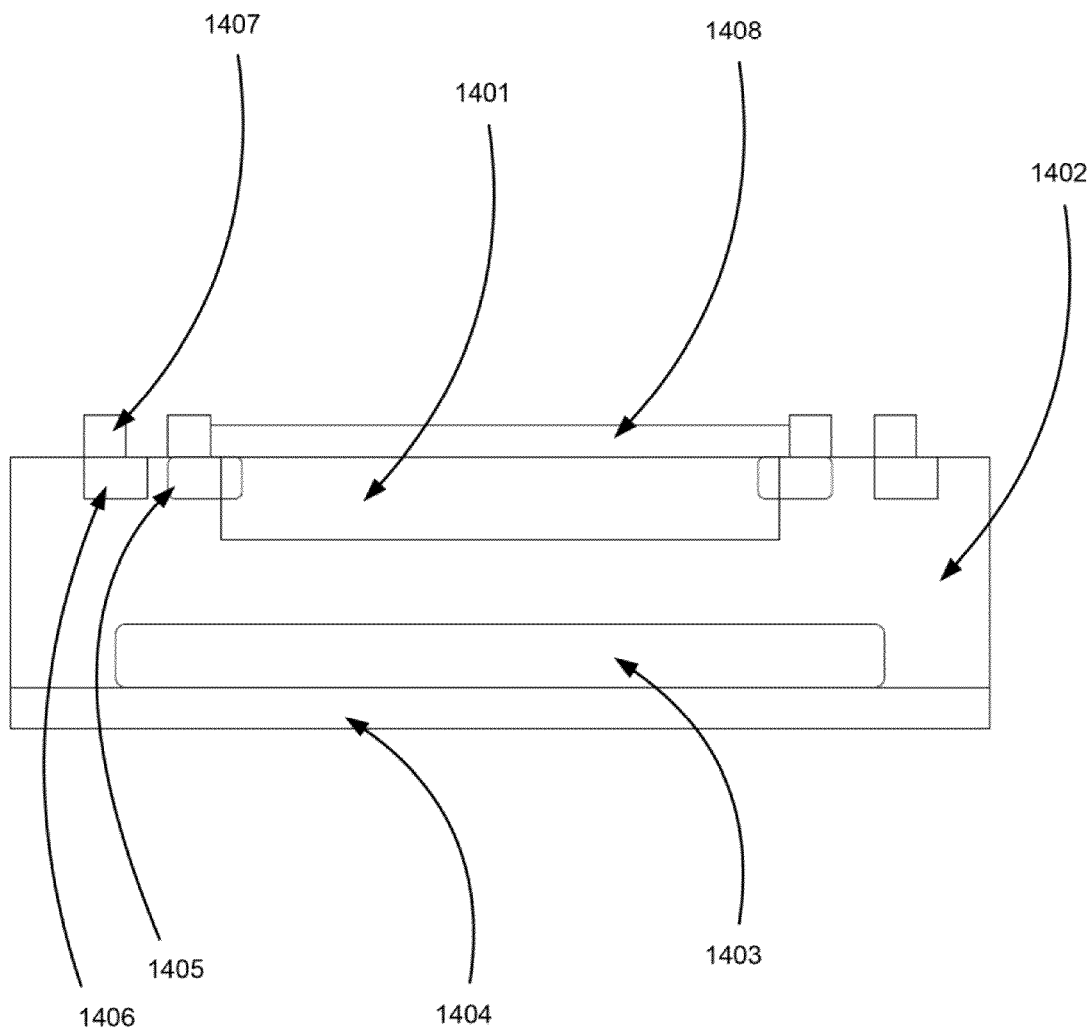
FIG. 14 shows an exemplary photo-detector prepared according to the present methods.

FIG. 14 illustrates an embodiment of a photo-detector designed and arranged to provide certain characteristics discussed above. For example, the photo-detector of FIG. 14 may have certain response and sensitivity characteristics, especially at longer wavelengths. Also, the photo-detector of FIG. 14 may be manufactured according to the steps given herein to provide the cross-sectional arrangement of FIG. 14. Connections and contacts can be achieved within the device for the purpose of connecting the device to a circuit or other electrical components. In some instances the resulting apparatus comprises a solar cell responsive to solar energy.

In the specific embodiment of FIG. 14, region 1401 comprises an annealed, laser-irradiated, ion-implanted region. Region 1402 comprises a semiconductor substrate such as silicon. Region 1403 comprises a doped region for making contact to metal pads or creating an internal electric field to collect photocarriers. Region 1404 comprises metal contacts to a backside device. Region 1405 comprises a doped region to make electrical contact to lased regions, and is an optional region of the apparatus or device. Region 1406 comprises a doped region for making contact to metal pads and/or acting as a guard ring to reduce dark current. Region 1407 comprises metal contacts to a frontside of said device; and Region 1408 comprises a passivation layer for device active area(s), which may comprise silicon dioxide or nitride or a combination thereof.

In some aspects or embodiments, the present devices include a substantially uniform photo-response across a spatial expanse of the device. For example, a substantially uniform responsivity can be achieved across a portion of the device's surface within a given range of incident wavelengths.

Without wishing to be bound by theory, the method of the invention may impart unique or desirable performance characteristics into the semiconductor substrate by introduction of other atoms and unique atomic arrangements. The method of the invention can follow or precede any number of typical semiconductor process steps, such as doping treatments, passivations, oxide growths/removals, metallization steps, etc. Those knowledgeable in the art will understand that the method of the invention can be incorporated into various processing methods associated with creating a semiconductor device.

As stated earlier, one embodiment hereof is directed to a semiconductor processing method, including providing a semiconductor material having at least a first surface; implanting a dopant into the semiconductor material so as to cause a plurality of ions to be present in at least a portion of said semiconductor material to some depth beneath the surface; and treating at least a portion of said surface with an energy source so as to restructure the semiconductor material in a region proximal to said portion of the first surface being treated.

In more specific preferred embodiments, the step of treating with the energy source may include treating with a coherent light source such as a laser source. In still more specific embodiments, the laser source may be a pulsed laser source, such as a short laser pulsed laser source. The length or duration of the pulses may be of almost an arbitrary character, but generally designed to accomplish the present objectives and provide the presently-described characteristics within the semiconductor material. For example, a pulsed laser with pulse lengths between about 20 femtoseconds and 50 nanoseconds is contemplated. Pulse lengths between 50 nanoseconds and 500 picoseconds in duration are also contemplated hereby. Pulse lengths may also be between about 50 femtoseconds and 50 picoseconds in duration in some embodiments.

The present method can in some embodiments provide useful devices or apparatus, and may be included in consumer, industrial, scientific, commercial, military, or other products. Certain devices made with the present techniques can provide a quantum efficiency of at least 40% and even upwards of about 60% in a device that is under about 1 micrometer in thickness. In still other embodiments, this quantum efficiency may be provided in a device having a thickness of less than about 400 nanometers, or even less than about 200 nanometers.

The ion implantation energy in some embodiments may be in the range of 500 eV to 500 keV. In some embodiments, the implanting may be of positive, negative, or electrically-neutral dopants. In a semiconductor having at least one surface available for treating, the dopants may be present in various embodiments in concentrations upward of about $0.5 \times 10^{16}$ atoms/cm$^3$ or more in a region of the semiconductor lying substantially between the surface and a depth of about 5 micrometers below the surface of the semiconductor. It should be noted that the semiconductor used in one or more of the present embodiments can comprise silicon (Si).

As to the dopant, the material may be doped in various embodiments using any one or more of: sulfur, selenium, germanium, carbon, argon, silicon, and tellurium. The dopant can provide a "hole" or a "electron" or be chemically-neutral.

As mentioned elsewhere in this application, desirable responsivity can be obtained from devices made and designed according to the present methods. For example, in some embodiments, the present methods can be used to make devices having a response of at least 0.5 Amperes/Watt (A/W) for at least one wavelength or range of wavelengths between 800 nanometers and 1250 nanometers. The response of the devices can be at least 40% greater than a response of a semiconductor material not having undergone the present treatments. In some embodiments, the present devices have a response of at least 0.15 A/W for at least one wavelength or range of wavelengths between 1150 and 1250 nanometers. It should be appreciated that the ranges given above are for illustrative purposes and other values for the present parameters may be comprehended.

The energetic process applied to the surface of the semiconductor can result in restructuring the material at or in the vicinity of the surface of the semiconductor. For example, crystallization can be achieved. Also, roughening of the surface can be achieved.

Again, the order in which the present steps of the process are applied are variable. In some embodiments an annealing step is carried out before or during the doping step. In other embodiments an annealing step is carried out before or during the doping step. Likewise, the annealing step can be performed before or after or during the stated roughening step.

While the present invention has been described in connection with the exemplary embodiments of the various Figures, it is not limited thereto and it is to be understood that other similar embodiments may be used or modifications and additions may be made to the described embodiments for performing the same function of the present invention without deviating therefrom. Therefore, the present invention should not be limited to any single embodiment, but rather should be construed in breadth and scope in accordance with the appended claims. Also, the appended claims should be construed to include other variants and embodiments of the invention, which may be made by those skilled in the art without departing from the true spirit and scope of the present invention.

The invention claimed is:

1. A method of controlling a photoresponse characteristic of a semiconductor device, comprising:
   providing a semiconductor material having at least one surface thereof;
   subjecting the surface to short-pulsed laser irradiation to roughen the surface;
   annealing the surface to heal undesired lattice damage imparted by the laser irradiation;

incorporating a dopant into a region of the semiconductor material beneath said surface by ion implantation; and annealing the surface to activate the dopant, wherein the semiconductor device has a substantially uniform photoresponse across at least a portion of the surface of the semiconductor device, wherein the substantially uniform photoresponse varies by less than 20% in said portion of the surface of the semiconductor device.

2. The method of claim 1, incorporating said dopant into said region comprising substantially uniformly incorporating said dopant into said region of said semiconductor beneath said surface of said semiconductor material and across said portion of the surface of said semiconductor material.

3. The method of claim 1, incorporating said dopant comprising substantially uniformly-incorporating said dopant to a concentration greater than about $0.5 \times 10^{16}$ atoms/cm$^3$ in said region of the semiconductor material to some depth beneath the surface of the semiconductor material.

\* \* \* \* \*